United States Patent [19]

Imahashi et al.

[11] Patent Number: 5,142,348
[45] Date of Patent: Aug. 25, 1992

[54] LATERAL THYRISTOR

[75] Inventors: Manabu Imahashi, Takatsuki; Hironori Kamiya, Toyonaka, both of Japan

[73] Assignee: Matsushita Electronics Corporation, Osaka, Japan

[21] Appl. No.: 566,520

[22] Filed: Aug. 13, 1990

[30] Foreign Application Priority Data

Aug. 16, 1989 [JP] Japan .................. 1-210954

[51] Int. Cl.⁵ .................. H01L 29/74; H01L 27/02; H01L 29/72
[52] U.S. Cl. .......................... 357/38; 357/43; 357/35; 357/34
[58] Field of Search ............ 357/38, 43, 35, 34

[56] References Cited

U.S. PATENT DOCUMENTS

| | | | |
|---|---|---|---|
| 4,246,594 | 1/1981 | Mori | 357/35 |
| 4,532,003 | 7/1985 | Beasom | 357/34 |
| 4,599,631 | 7/1986 | Tsuzuki | 357/34 |
| 4,821,095 | 4/1989 | Temple | 357/38 |
| 4,901,132 | 2/1990 | Kuwano | 357/35 |
| 4,942,440 | 7/1990 | Baliga et al. | 357/43 |
| 4,942,446 | 7/1990 | Yakushiji | 357/38 |

FOREIGN PATENT DOCUMENTS 56-15066 2/1981 Japan .................. 357/43
61-263270 11/1986 Japan .

Primary Examiner—Andrew J. James
Assistant Examiner—Daniel N. Russell
Attorney, Agent, or Firm—Ratner & Presita

[57] ABSTRACT

A lateral thyristor is provided which includes a semiconductor substrate of a first conductivity type, an epitaxial layer of a second conductivity type formed on the semiconductor substrate, an anode diffusion layer of the first conductivity type formed in the epitaxial layer, a gate diffusion layer of the first conductivity type formed in the epitaxial layer, and a buried layer of the second conductivity type formed below the anode diffusion layer and extending between the semiconductor substrate and the epitaxial layer, wherein there is a region directly below the anode diffusion layer where the anode diffusion layer and the buried layer do not overlap each other, when the lateral thyristor is looked down upon in a direction perpendicular to the principal surface of the semiconductor substrate.

6 Claims, 11 Drawing Sheets

LATERAL THYRISTOR

BACKGROUND OF THE INVENTION

1. Field of the invention:

This invention relates to a lateral thyristor, and more particularly, to a lateral thyristor suitable for use as a driver for flat display panels.

2. Description of the prior art:

In recent years, development of flat display panels for displaying images has been extensively carried out.

A flat display panel has a plurality of X electrodes (acting as scanning lines) disposed parallel to each other and a plurality of Y electrodes (acting as signal lines) disposed perpendicular to the X electrodes. At each of the intersections between the X and Y electrodes on the panel, there is disposed a pixel which is connected to the X and Y electrodes intersecting each other. The pixels are arranged in a matrix form on the panel.

The selection of a specific pixel is accomplished by applying a predetermined voltage between the X and Y electrodes connected to that pixel by means of a driver or the like.

In a self-luminescent flat display panel such as a plasma display panel, current flows between the selected electrodes, thereby emitting light. The current is supplied through the driver.

Because of the advantage of relatively high current capacity, lateral thyristors with the cathode as the input terminal and the anode as the output terminal have come to be used as drivers to drive self-luminescent flat display panels such as plasma display panels.

FIG. 18 is a plan view showing a conventional lateral thyristor. FIG. 19 is a cross section taken along line D—D of the lateral thyristor shown in FIG. 18.

The conventional lateral thyristor has a P-type semiconductor substrate 7, an N⁻-type epitaxial layer 4 grown on the semiconductor substrate 7, and a P⁺-type anode diffusion layer 1 and a P⁺-type gate diffusion layer 2 both formed within the epitaxial layer 4, and an N⁺-type cathode diffusion layer 3 formed within the gate diffusion layer 2.

An N⁺-type buried layer 5 is formed below the anode diffusion layer 1 and extending between the semiconductor substrate 7 and the epitaxial layer 4.

In the epitaxial layer 4, a P⁺-type isolating diffusion layer 6 is formed so as to surround the region where the anode diffusion layer 1, the gate diffusion layer 2, and the cathode diffusion layer 3 are formed.

The conventional lateral thyristor has the following problem when used as a driver for a self-luminescent flat display panel having discharge cells.

There is a possibility, when the flat display panel is being driven, that the "on" voltage applied between the anode diffusion layer 1 and the cathode diffusion layer 3 of the lateral thyristor (i.e., the voltage between the anode diffusion layer 1 and the cathode diffusion layer 3 in the conducting state) may rise to a level to cut off the thyristor, causing unstable operation of the lateral thyristor. Such an unstable increase or decrease in the "on" voltage for the lateral thyristor will cause flicker in the images being produced on the flat display panel.

The cause of the above problem will hereinafter be discussed with reference to FIG. 20 showing the transient characteristics of the voltage applied between the anode diffusion layer 1 and the cathode diffusion layer 3 of the conventional lateral thyristor.

First, let us suppose that the lateral thyristor is in the cut-off state. In this state, no current is flowing between the electrode connected to the lateral thyristor (i.e., the X electrode on the flat display panel) and the opposing electrode (i.e., the Y electrode on the flat display panel).

The voltage characteristics in this state are represented by the region "a" in FIG. 20. The potentials at the cathode diffusion layer 3, the isolating diffusion layer 6, the semiconductor substrate 7, and the gate diffusion layer 2 are set at a minimum level, for example, at zero volts, while the potential at the anode diffusion layer 1 is set at a predetermined high level, for example, at 100 volts.

When a voltage is applied to the gate diffusion layer 2 at least 0.7 volt higher than the potential at the cathode diffusion layer 3, the lateral thyristor switches from the cut-off state to the conducting state, causing current to flow from the anode diffusion layer 1 to the cathode diffusion layer 3. This causes the "on" voltage ($V_{OL}$) between the anode diffusion layer 1 and the cathode diffusion layer 3 to drop to 2-3 volts (represented by the region "b" in FIG. 20).

The plasma display panel has discharge cells which act as pixels. When the lateral thyristor which is the driver for the plasma display panel becomes conducting, a sufficiently high voltage is applied between the X electrode in the discharge cell (acting as a pixel) connected to the lateral thyristor and the Y electrode disposed within that discharge cell and corresponding to the X electrode. This causes discharge to occur in the discharge cell, causing the plasma therein to emit light for display.

When a predetermined time has elapsed after initiation of the discharge, the discharge current flowing between the electrodes in the discharge cell (i.e., the X and Y electrodes) temporarily reaches the magnitude two to five times greater than that of the current flowing in the steady-state condition. Specifically, a current of $1 \times 10^4 - 3 \times 10^4$ amperes/cm² or greater may flow into one anode diffusion layer 1. When such an excessive current flows into the anode diffusion layer 1, the "on" voltage ($V_{OL}$) temporarily rises by a large extent. The increased value ($\Delta V_{OL}$) of the "on" voltage momentarily reaches to 30-40 volts (represented by the region "c" in FIG. 20).

Such a high voltage causes the lateral thyristor to be put in the near cut-off state, resulting in an unstable operation of the lateral thyristor.

When the discharge is stabilized to the steady-state condition, since the current flowing into the anode diffusion layer 1 decreases, $V_{OL}$ drops to a relatively low level (represented by the region "d" in FIG. 20).

After that, when the potential at the gate diffusion layer 2 is lowered to approximately the same level as the potential at the cathode diffusion layer 3, the lateral thyristor switches from the conducting state to the cut-off state. The speed of this change (i.e., switching speed) is dependent on the speed at which the carriers stored in the epitaxial layer 4 vanish. In the above conventional lateral thyristor, since the carriers are absorbed rapidly into the buried layer 5, the switching speed is sufficiently high.

After the thyristor has been switched from the conducting state to the cut-off state, the "on" voltage ($V_{OL}$) gradually increases to return to the initial value (i.e., 100 volts) (represented by the region "e" in FIG. 20).

Thus, in the conventional lateral thyristor, when an excessive current flows into the anode diffusion layer 1 with the thyristor being in the conducting state, the "on" voltage ($V_{OL}$) increases by tens of volts from the steady-state value. Therefore, in the flat display panel using the conventional lateral thyristor as the driver, the voltage between the electrodes (i.e., the X and Y electrodes) drops by the value corresponding to the increase ($\Delta V_{OL}$) of the "on" voltage. This makes it impossible to obtain an enough voltage to light the pixel, causing flicker in the images being produced.

Such a problem can be encountered not only in cases where the conventional lateral thyristor is used as the driver of a self-luminescent flat display panel having discharge cells, but also in cases where the lateral thyristor is used as the driver of any other self-luminescent flat display panel. Furthermore, the same problem may be encountered in all cases where the lateral thyristor is used under the condition that a large current flows into the anode diffusion layer 1.

SUMMARY OF THE INVENTION

The lateral thyristor of this invention, which overcomes the above-discussed and numerous other disadvantages and deficiencies of the prior art, comprises a semiconductor substrate of a first conductivity type, an epitaxial layer of a second conductivity type formed on the semiconductor substrate, an anode diffusion layer of the first conductivity type formed in the epitaxial layer, a gate diffusion layer of the first conductivity type formed in the epitaxial layer, and a buried layer of the second conductivity type formed below the anode diffusion layer and extending between the semiconductor substrate and the epitaxial layer, wherein there is a region directly below the anode diffusion layer where the anode diffusion layer and the buried layer do not overlap each other, when the lateral thyristor is looked down upon in a direction perpendicular to the principal surface of the semiconductor substrate.

In a preferred embodiment, the ratio of the area of the region where the anode diffusion layer is formed in the epitaxial layer to the area of the region where the anode diffusion layer and the buried layer do not overlap each other, when the above-mentioned lateral thyristor is looked down upon a direction perpendicular to the principal surface of the semiconductor substrate, is in the range of 10% to 90%.

In a preferred embodiment, the above-mentioned semiconductor substrate is grounded.

In a preferred embodiment, a resistor is provided between the semiconductor substrate and the anode diffusion layer.

In a more preferred embodiment, the above-mentioned resistor is a polysilicon resistor.

In a more preferred embodiment, the above-mentioned lateral thyristor further comprises a fourth diffusion layer of the first conductivity type formed in the anode diffusion layer, the fourth diffusion layer of the first conductivity type being shallow as compared with the anode diffusion layer, a portion of the fourth diffusion layer of the first conductivity type extending outside the region where the anode diffusion layer is formed and being electrically connected to the epitaxial layer, and the fourth diffusion layer of the first conductivity type being also electrically connected to the extending portion of the anode diffusion layer through a wiring formed above the epitaxial layer, wherein the portion of the anode diffusion layer below the fourth diffusion layer of the first conductivity type acts as the resistor.

Thus, the invention described herein makes possible the objectives of (1) providing a lateral thyristor in which the voltage between the anode diffusion layer and the cathode diffusion layer does not fluctuate readily even when a large current flows into the anode diffusion layer with the lateral thyristor being in the conducting state; (2) providing a lateral thyristor in which an increase in the "on" voltage can be made small even when a large current flows into the anode diffusion layer with the lateral thyristor being in the conducting state, thereby causing no flicker in the images on the flat display panel with the lateral thyristor used as the driver; and (3) providing a lateral thyristor in which the possibility of faulty operation due to external noises can be eliminated, resulting in an improved reliability.

BRIEF DESCRIPTION OF THE DRAWINGS

This invention may be better understood and its numerous objectives and advantages will become apparent to those skilled in the art by reference to the accompanying drawings as follows.

DESCRIPTION OF THE PREFERRED EMBODIMENTS

Example 1

Figure 1:
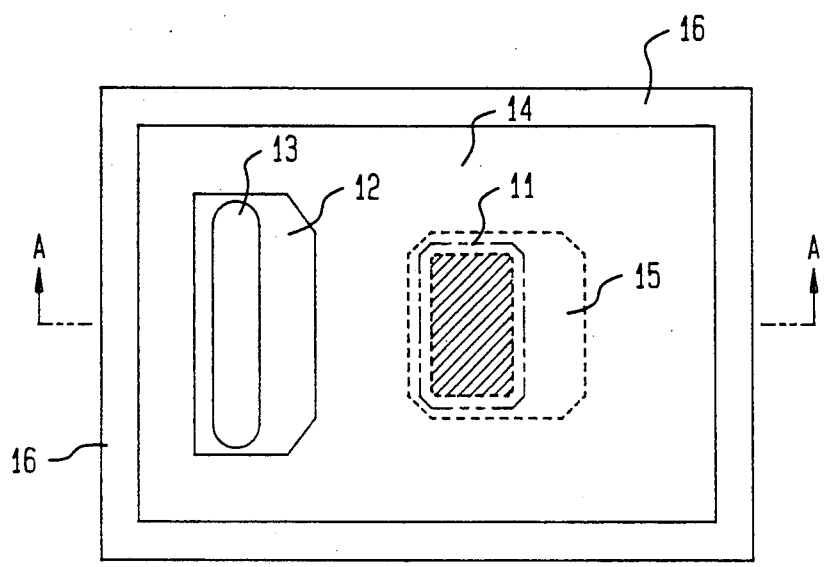
FIG. 1 is a schematic plan view showing a lateral thyristor of this invention.
Figure 2:
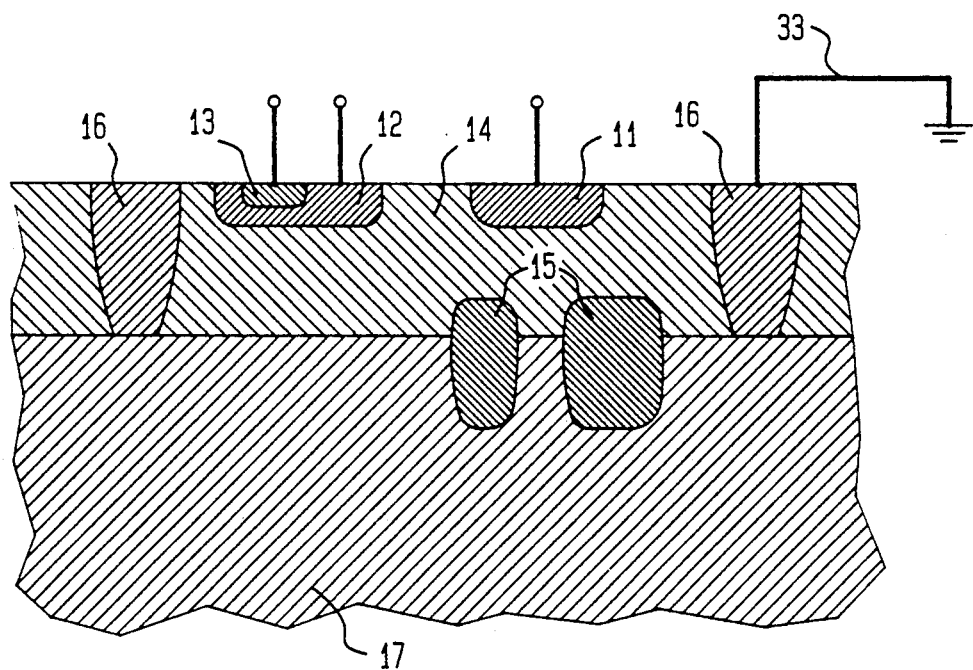
FIG. 2 is a schematic sectional view taken along line A—A of FIG. 1.

FIG. 1 shows a lateral thyristor of this invention. FIG. 2 is a schematic sectional view taken along line A—A of FIG. 1.

The lateral thyristor of this example comprises a P-type semiconductor substrate 17, an N⁻-type epitaxial layer 14 formed on the semiconductor substrate 17, a P⁺-type anode diffusion layer 11 and a P⁺-type gate diffusion layer 12 both formed within the epitaxial layer 14, and an N⁺-type cathode diffusion layer 13 formed within the gate diffusion layer 12.

An N⁺-type buried layer 15 is formed below the anode diffusion layer 11 and extending between the semiconductor substrate 17 and the epitaxial layer 14.

In the epitaxial layer 14, a P⁺-type isolating layer 16 is formed so as to surround the region where the anode diffusion layer 11, the gate diffusion layer 12, and the cathode diffusion layer 13 are formed. By the isolating layer 16, a plurality of lateral thyristors and other elements formed on the semiconductor substrate 17 are electrically isolated each other.

The buried layer 15 is formed in a doughnut shape. The size of the region where the buried layer 15 is formed (i.e., the outermost circumference of the buried layer 15) is about 70 $\mu$m × about 70 $\mu$m on the principal surface of the semiconductor substrate 17. The size of the region below the anode diffusion layer 11 and surrounded by the buried layer 15 (the region that corresponds to the hollow portion of the doughnut) is about 30 $\mu$m × about 52 $\mu$m. The buried layer 15 has a thickness of about 8.5 $\mu$m across the portion thereof formed in the semiconductor substrate 17 and about 4 $\mu$m across the portion thereof formed in the epitaxial layer 14.

The size of the buried layer 15 may be changed from the values employed in this example according to the needs of design.

The concentration in the buried layer 15 is approximately $2 \times 10^{19}$ cm⁻³. If the concentration is higher than about $10^{18}$ cm⁻³, the speed for the buried layer 15 to absorb carriers is sufficiently high, with which a sufficiently fast switching speed as a driver can be achieved in practical use.

The main feature of the lateral thyristor of this example as compared with a conventional lateral thyristor is that when the lateral thyristor of this example is looked down upon in a direction perpendicular to the principal surface of the semiconductor substrate 17, the region where the anode diffusion layer 11 and the buried layer 15 do not overlap each other is positioned directly below the anode diffusion layer 11.

Since the region where the anode diffusion layer 11 and the buried layer 15 do not overlap each other is positioned directly below the anode diffusion layer 11, a parasitic vertical PNP transistor is formed which comprises the P⁺-type anode diffusion layer 11, the N⁻-type epitaxial layer 14, and the P-type semiconductor substrate 17.

Figure 3:
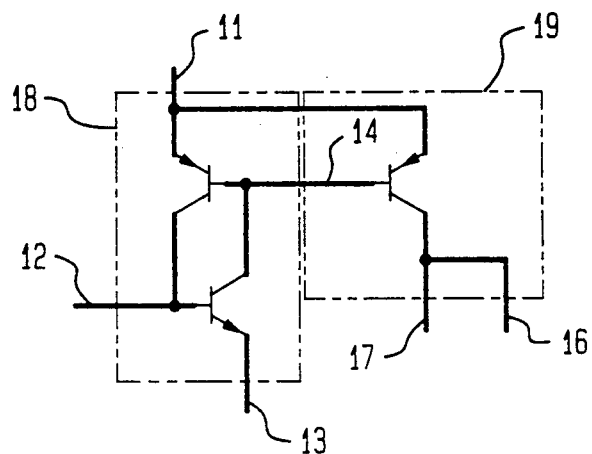
FIG. 3 is a diagram showing an equivalent circuit of the lateral thyristor of FIG. 1.

FIG. 3 shows an equivalent circuit of the lateral thyristor of this example. The portion of the circuit surrounded by a broken line indicates a circuit which functions as the lateral thyristor, while the portion thereof surrounded by a dashed line with a dot between the dashes indicates a parasitic circuit which functions as the vertical PNP transistor.

The region directly below the anode diffusion layer 11 where the anode diffusion layer 11 and the buried layer 15 do not overlap each other is indicated by oblique hatching in FIG. 1. As the area of this region is made wider, the current that can flow from the anode diffusion layer 11 to the semiconductor substrate 17 through the parasitic PNP transistor increases. This is because the area of the parasitic PNP transistor increases as the above-mentioned area is made wider.

According to this example, if an excessive current flows into the anode diffusion layer 11, the parasitic PNP transistor serves as a bypass, thereby preventing the function of the thyristor from being affected by the excessive current. As a result, the voltage between the anode diffusion layer 11 and the cathode diffusion layer 13 is maintained at a stable level as compared with the conventional lateral thyristor.

Therefore, when the lateral thyristor of this example is used as the driver for a flat display panel, no flicker is caused in the images on the flat display panel even if an excessive current flows momentarily into the anode diffusion layer 11.

Figure 4:
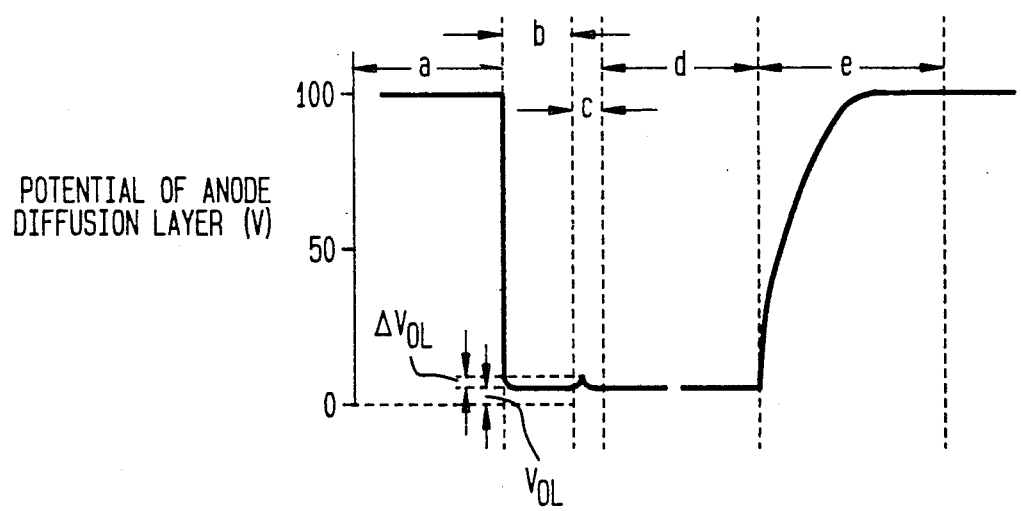
FIG. 4 is a graph showing the transient characteristics of the "on" voltage obtained when the lateral thyristor of FIG. 1 is used as the driver for a flat display panel.

FIG. 4 shows the transient characteristics of the voltage between the anode diffusion layer 11 and the cathode diffusion layer 13 when the lateral thyristor of this example is used as the driver for a selfluminescent flat display panel having discharge cells. The following will describe the transient characteristics with reference to FIG. 4.

First, let us suppose that the lateral thyristor is in the cut-off state. In this state, no current is flowing between the electrode connected to the lateral thyristor (i.e., the X electrode on the flat display panel) and the opposing electrode (i.e., the Y electrode on the flat display panel). The voltage characteristics in this state are represented by the region "a" in FIG. 4. The potentials at the cathode diffusion layer 13, the isolating diffusion layer 16, the semiconductor substrate 17, and the gate diffusion layer 12 are set at a minimum level, for example, at zero volts. The potential at the anode diffusion layer 11 is set at a predetermined high level, for example, at 100 volts.

When a voltage is applied to the gate diffusion layer 12 at least 0.7 volts higher than the potential at the cathode diffusion layer 13, the lateral thyristor switches from the cut-off state to the conducting state, causing current to flow from the anode diffusion layer 11 to the cathode diffusion layer 13. This causes the potential at the anode diffusion layer 11 to drop to 2-3 volts (represented by the region "b" in FIG. 4).

After initiation of the discharge, if an excessive current flows into the anode diffusion layer 11, there is caused substantially no increase in the "on" voltage ($V_{OL}$) between the anode diffusion layer 11 and the cathode diffusion layer 13 of the lateral thyristor. This is because the excessive current flowing into the anode diffusion layer 11 passes through the vertical parasitic PNP transistor into the semiconductor substrate 17.

When the discharge is stabilized to the steady-state condition, since the current flowing into the anode diffusion layer 11 decreases, $V_{OL}$ drops to a relatively low level (represented by the region "d" in FIG. 4).

After that, when the potential at the gate diffusion layer 12 is lowered to approximately the same level as the potential at the cathode diffusion layer 13, the lateral thyristor switches from the conducting state to the cut-off state. The speed of this change (i.e., switching speed) is dependent on the speed at which the carriers stored in the epitaxial layer 14 vanish. In this example, since the carriers are absorbed rapidly into the buried layer 15, the switching speed is sufficiently high.

After the thyristor has been switched from the conducting state to the cut-off state, $V_{OL}$ gradually increases to return to the initial value (100 volts) (represented by the region "e" in FIG. 4).

Figure 17:
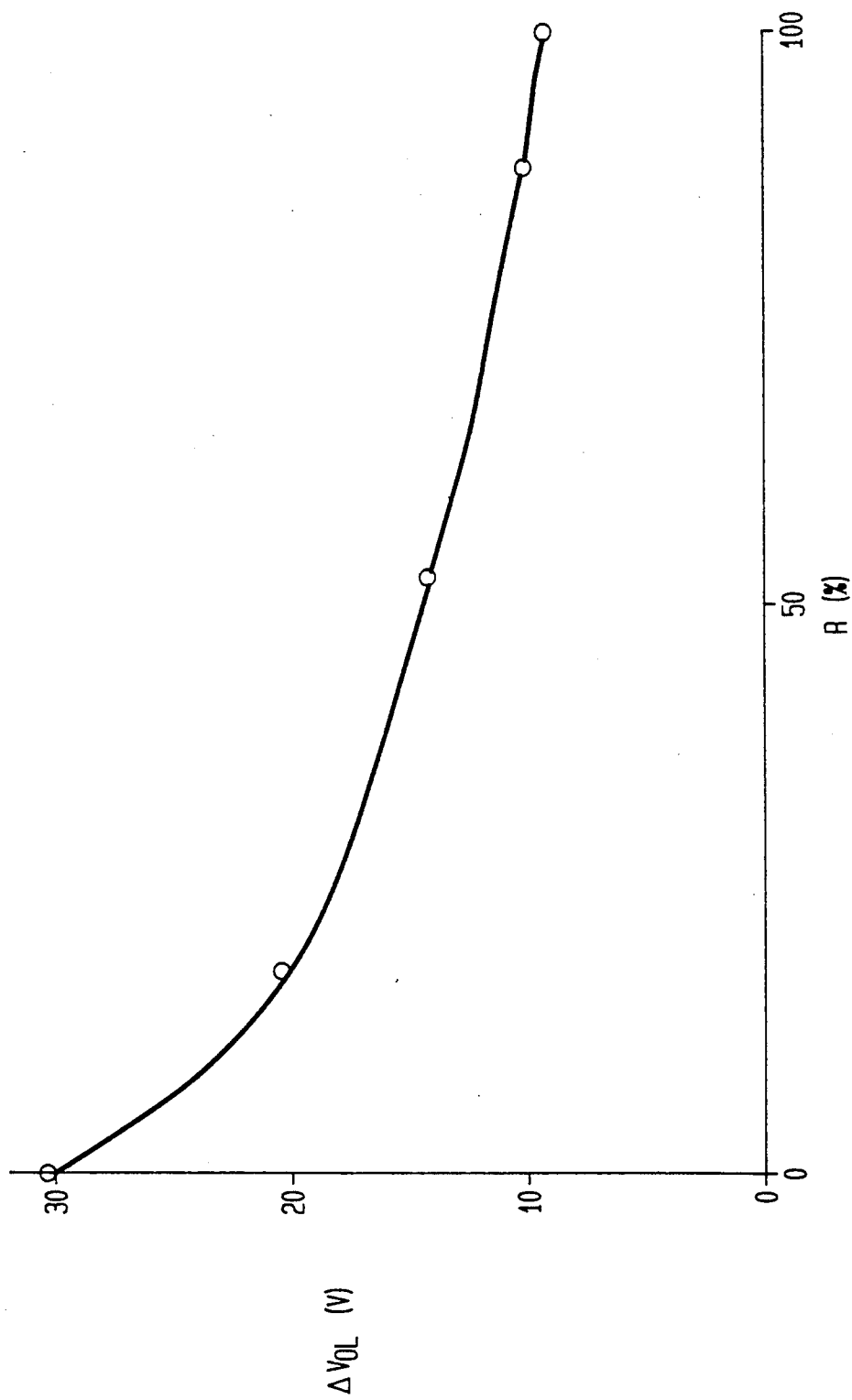
FIG. 17 is a graph showing the relationship between the area ratio R and the increase $\Delta V_{OL}$.
Figure 18:
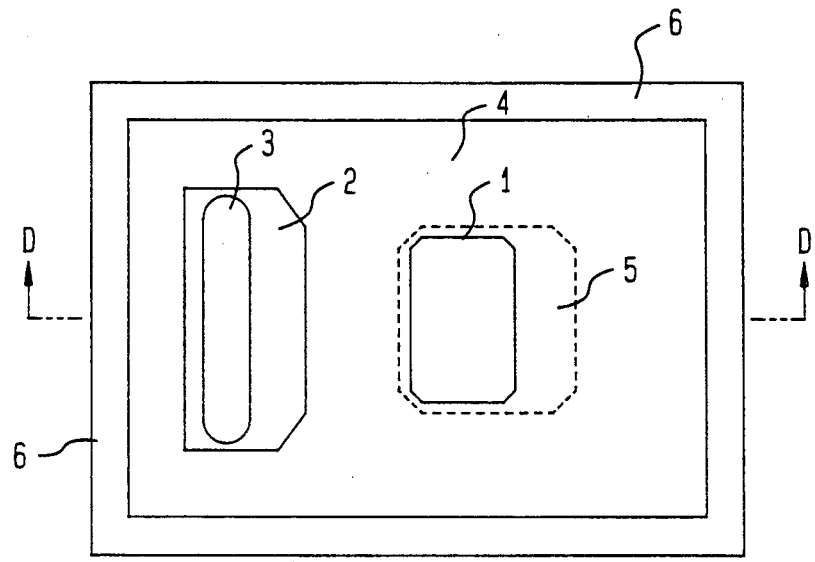
FIG. 18 is a schematic plan view showing a conventional lateral thyristor.
Figure 19:
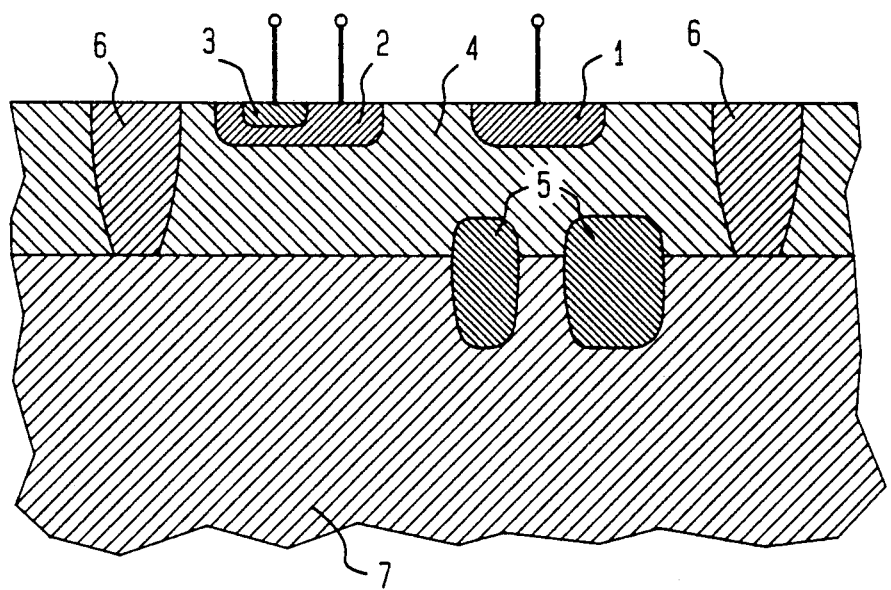
FIG. 19 is a schematic sectional view taken along line D—D of FIG. 18.
Figure 3:
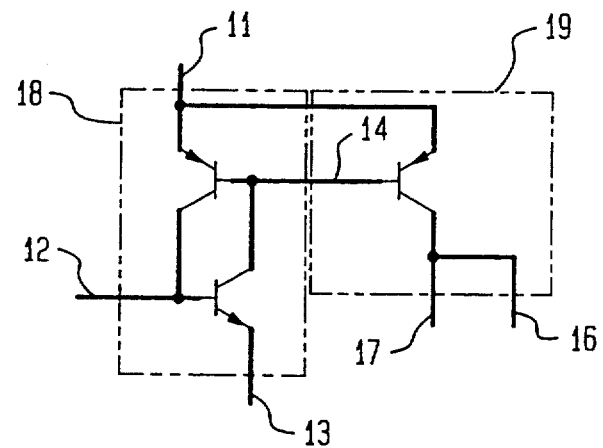
Figure 4:
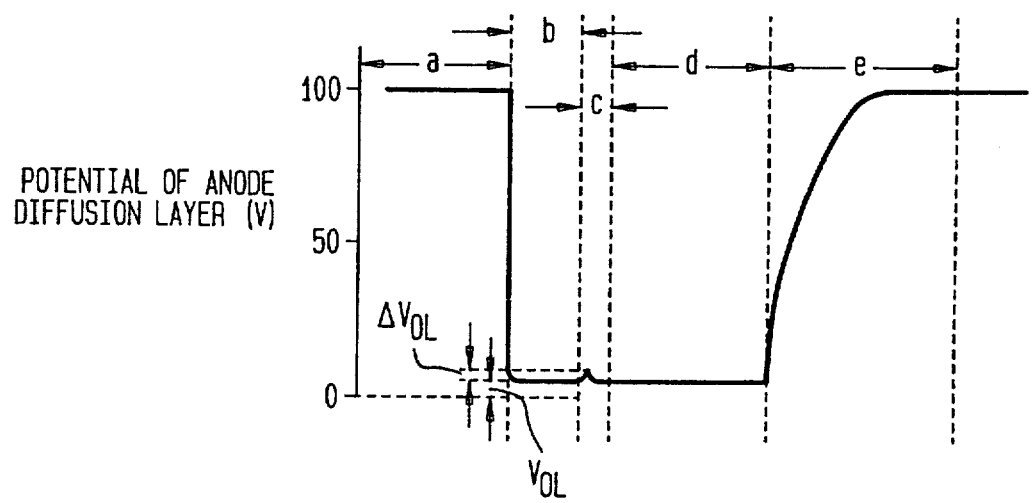
Figure 10:
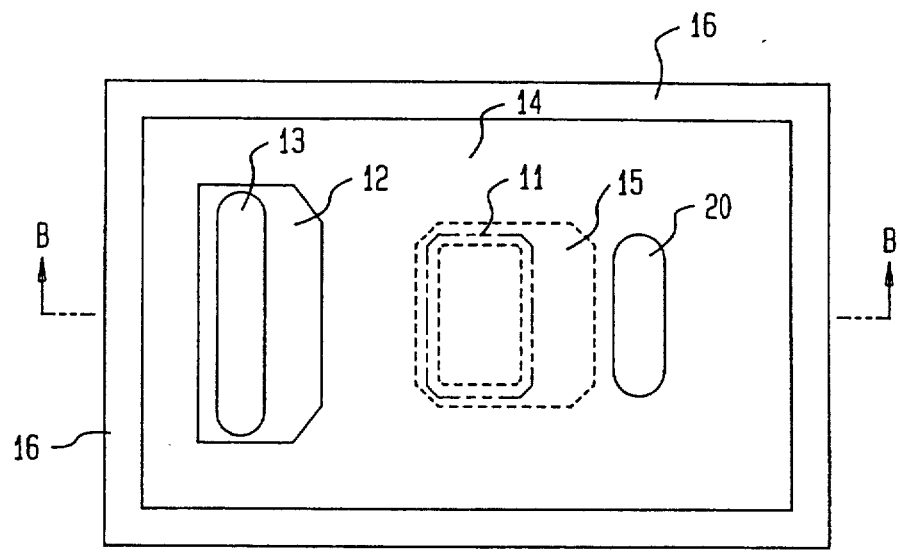
Figure 11:
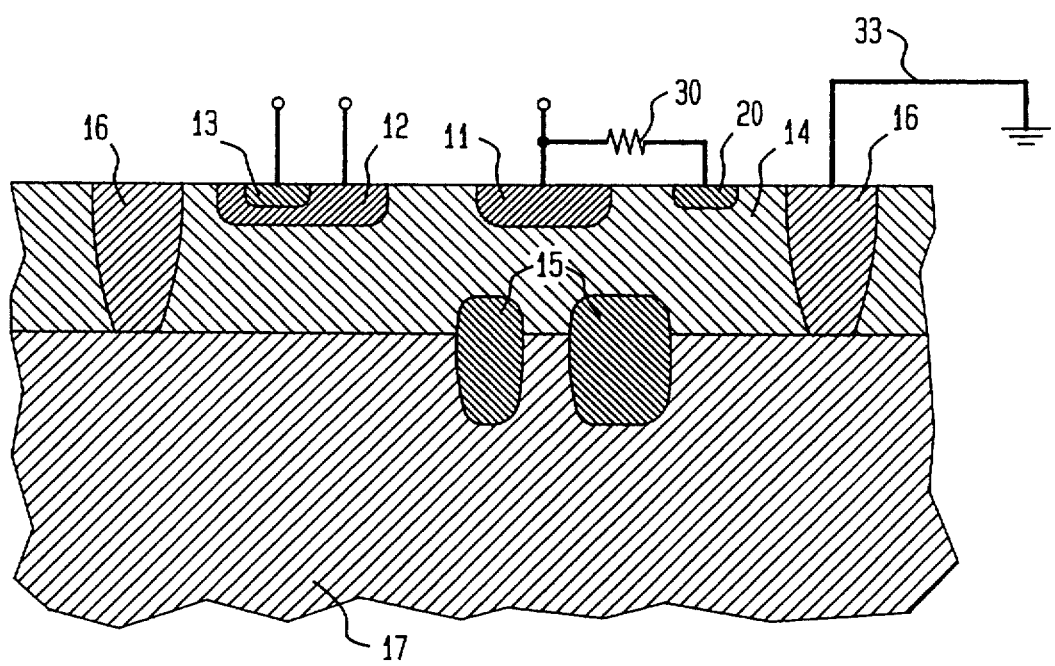
Figure 12:
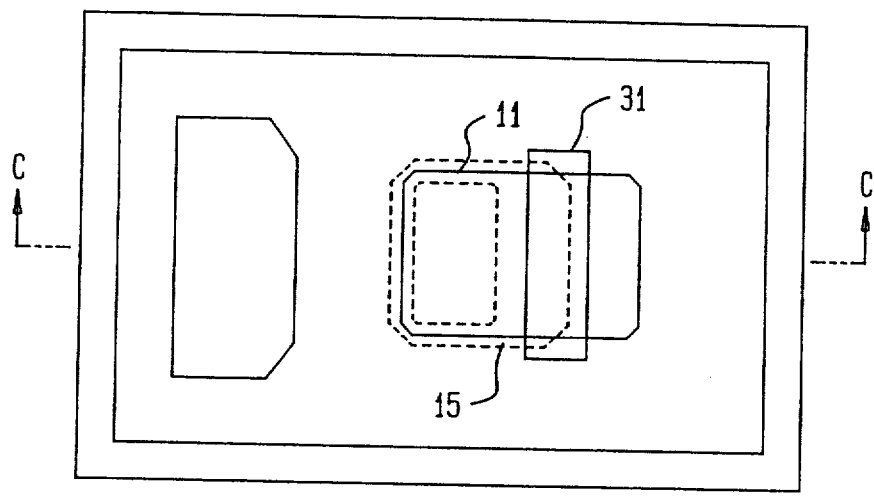
Figure 13:
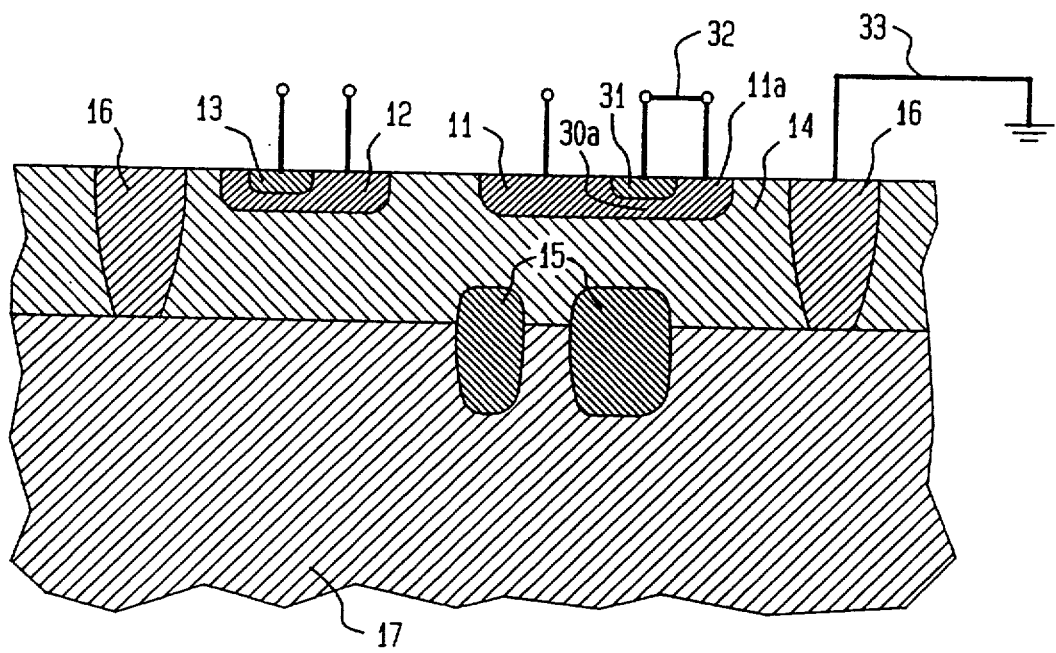
Figure 18:
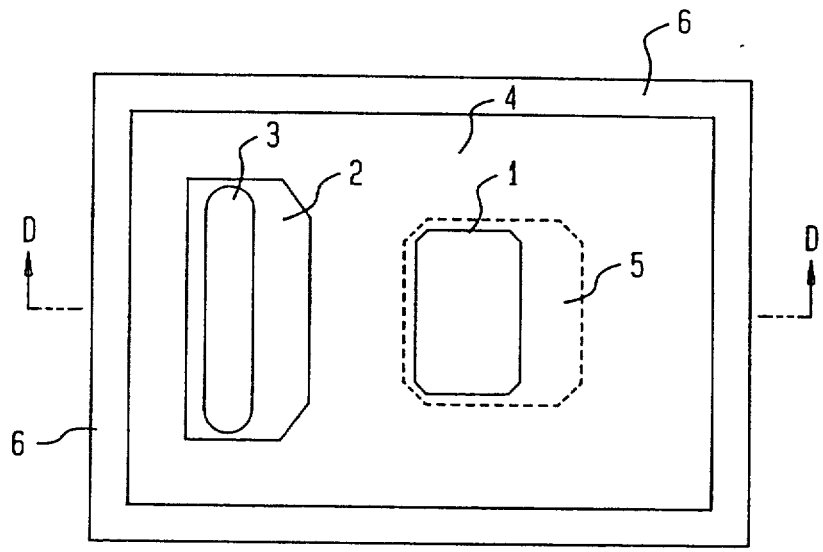
Figure 19:
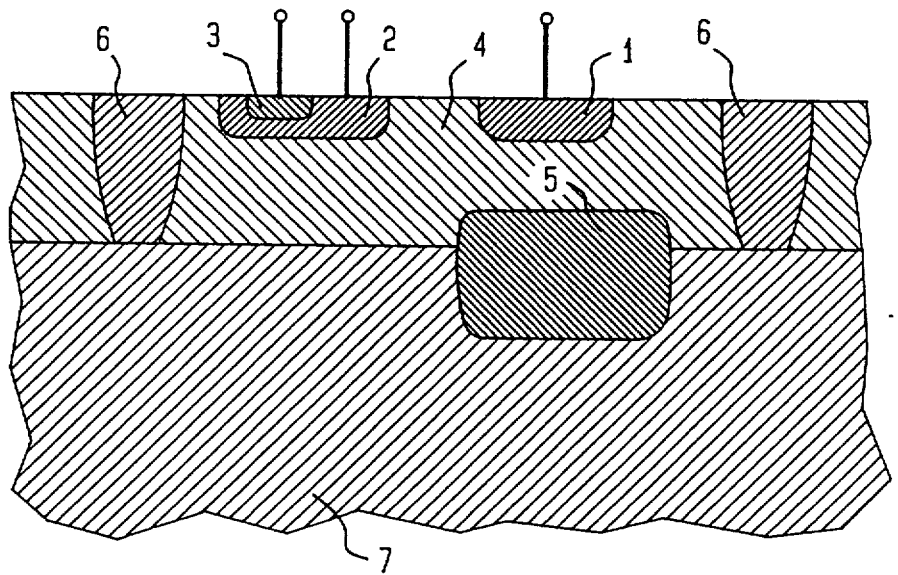

FIG. 17 shows the relationship of $\Delta V_{OL}$ with respect to the ratio of the area of the region directly below the anode diffusion layer 11 where the anode diffusion layer 11 and the buried layer 15 do not overlap each other to the area of the region where the anode diffusion layer 11 is formed (hereinafter referred to as the area ratio R).

As can be seen from FIG. 17, as the area ratio R is made larger, $\Delta V_{OL}$ decreases. In particular, when the area ratio R is 100%, the value of $\Delta V_{OL}$ is the smallest. As the value of $\Delta V_{OL}$ is made smaller, the anode diffusion layer 11 of the lateral thyristor has a higher current capacity, which is desirable.

On the other hand, reducing the volume of the buried layer 15 involves another problem of decreased switching speed of the lateral thyristor because the carriers injected into the epitaxial layer 14 are not sufficiently absorbed into the buried layer 15. It has been found from a series of experiments that the ratio of the area of the above-mentioned region to the area of the region where the anode diffusion layer 11 is formed is preferably in the range of 10% to 90%.

In this example, the area ratio R is 70%, and $\Delta V_{OL}$ is 12 volts.

Example 2

Figure 5:
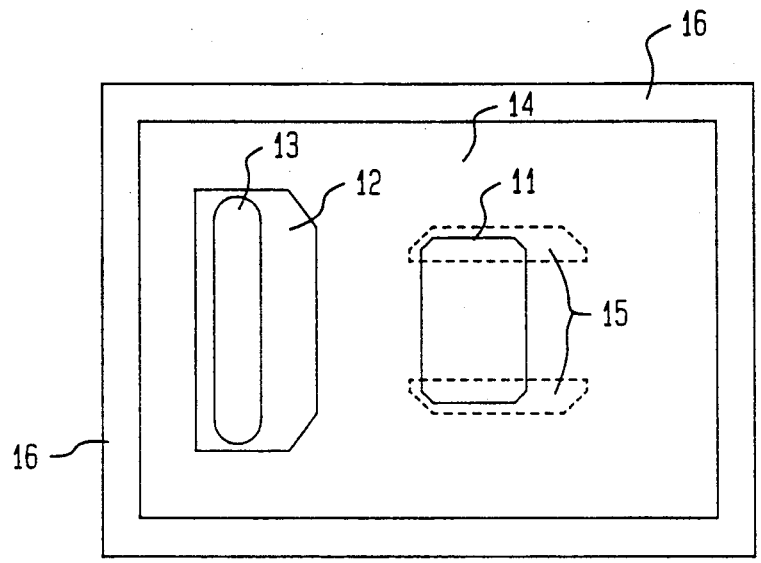
FIG. 5 is a schematic plan view showing another lateral thyristor of this invention.
Figure 6:
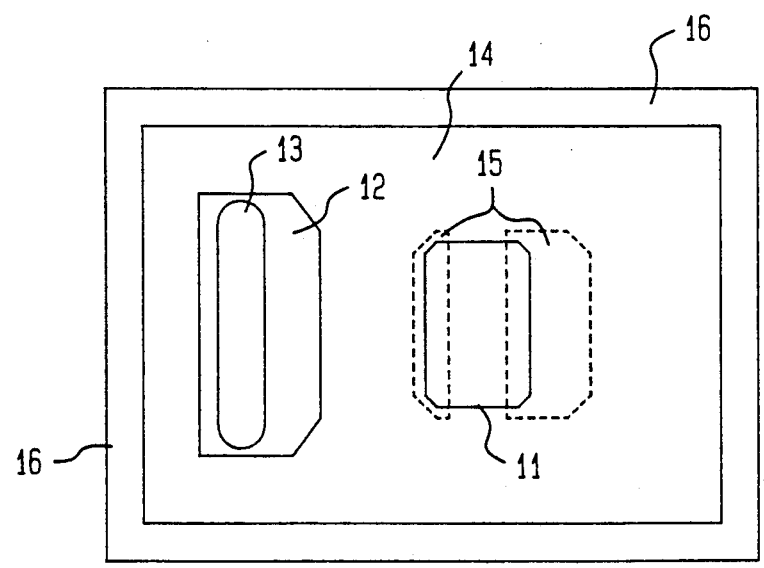
FIGS. 6 to 9 are schematic plan views showing various modified lateral thyristors of this invention, each of which has a buried layer of a different shape from that employed in the lateral thyristor of FIG. 5.
Figure 7:
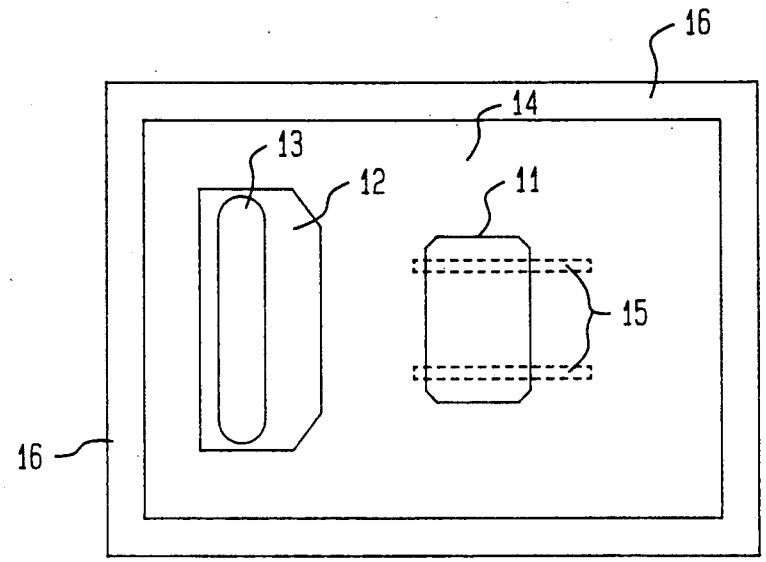
Figure 8:
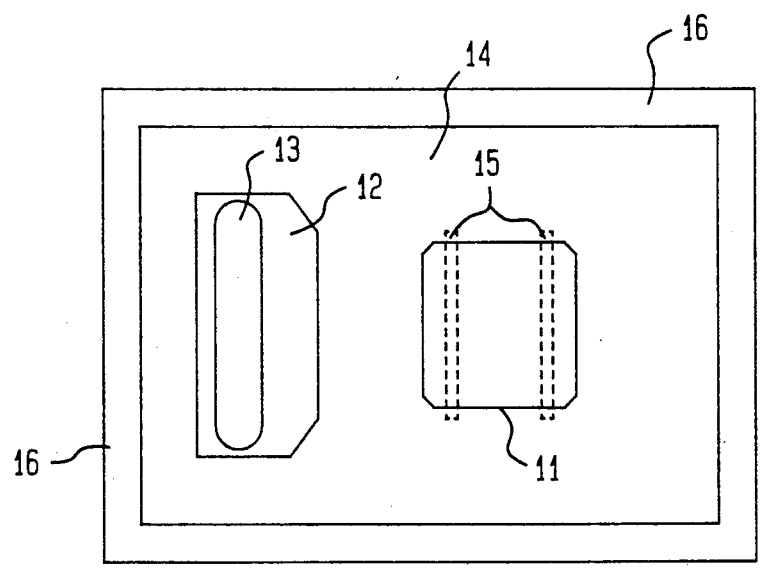
Figure 9:
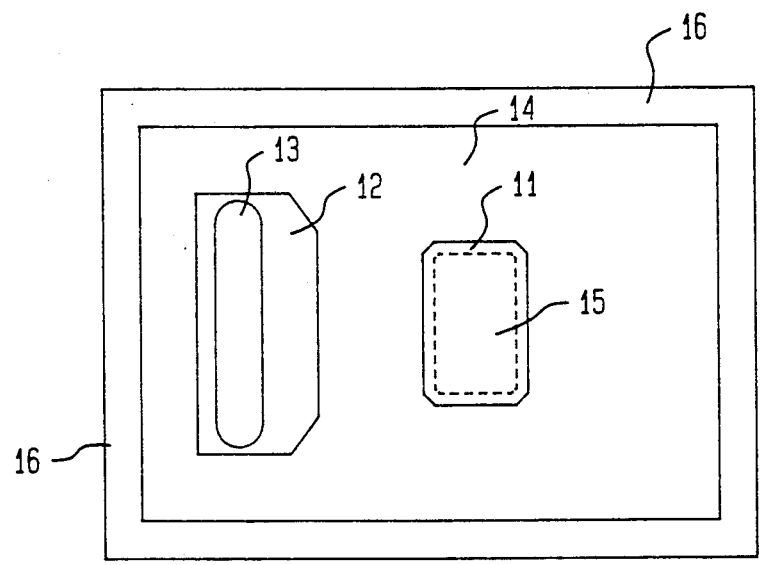

FIG. 5 shows another lateral thyristor of this invention.

The major difference in the construction between the lateral thyristor of this example and that of Example 1 is the planar shape of the buried layer 15 (i.e., the shape shown by a broken line in the FIG. 5). Otherwise, the lateral thyristor of this example has the same construction as that of Example 1.

In general, there is the possibility that the position of the buried layer 15 with respect to the position of the anode diffusion layer 11 may vary because of variations in the mask alignment. Since there is a close relationship between the above-mentioned area and the $\Delta V_{OL}$ as previously noted, any variation in the area due to a cause in the producing process will result in a variation in the characteristics of the lateral thyristor from element to element.

However, the lateral thyristor having the buried layer 15 of the planar shape shown in FIG. 5 is free from the above-mentioned problem in the producing process. This is because with the shape of the buried layer 15 shown in FIG. 5, the area of the region directly below the anode diffusion layer 11 where the anode diffusion layer 11 and the buried layer 15 do not overlap each other does not substantially change even when the mask alignment varies.

Accordingly, the construction shown in FIG. 5 has the advantage of reducing the variation in the characteristics of the lateral thyristor from element to element.

In this example, the area ratio R is 50%, and $\Delta V_{OL}$ is 15 volts.

The planar shapes of the buried layer 15 that can provide the above-mentioned advantage includes those shown in FIGS. 6 to 9.

Example 3

Figure 10:
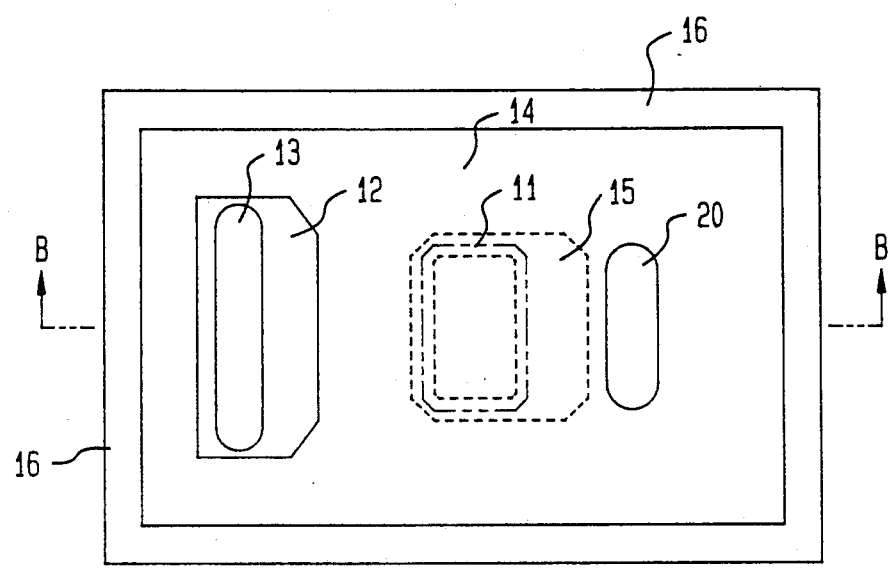
FIG. 10 is a schematic plan view showing still another lateral thyristor of this invention.
Figure 11:
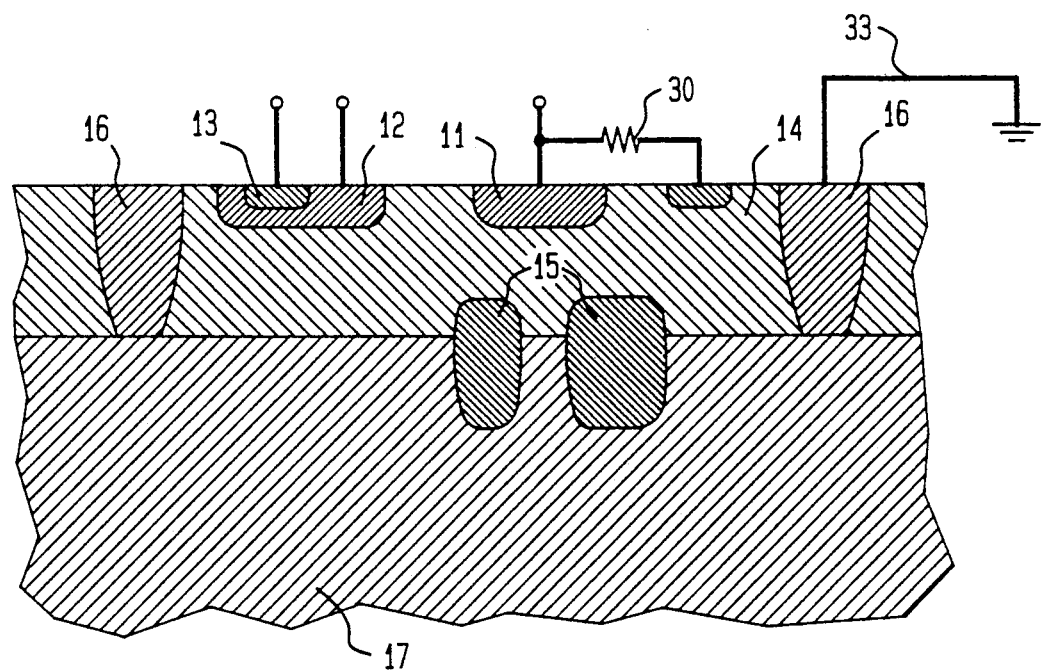
FIG. 11 is a schematic sectional view taken along line B—B of FIG. 10.

FIG. 10 shows still another lateral thyristor of this invention. FIG. 11 is a schematic sectional view taken along line B—B of FIG. 10.

The lateral thyristor of this example differs in construction from the lateral thyristor of Example 1 in that an N-type diffusion layer 20 is formed within the epitaxial layer 14 and a resistor is provided between the diffusion layer 20 and the wiring connected to the anode diffusion layer 11. Otherwise, the lateral thyristor of this example has the same construction as that of Example 1.

In the lateral thyristor of this example with the above-mentioned construction, the carriers injected into the epitaxial layer 14 are rapidly discharged to the outside of the lateral thyristor through the diffusion layer 20, the resistor 30, and the anode electrode connected to the anode diffusion layer 11. Also, according to this construction, the vertical parasitic PNP transistor can be prevented from accidentally conducting even when noise is applied to the epitaxial layer 14 from the outside of the lateral thyristor.

Such an advantage can be obtained because the base-emitter impedance of the parasitic PNP transistor drops due to the presence of the resistor 30.

A polysilicon resistor may be used for the resistor, which is formed on the insulating film grown on the epitaxial layer 14. Also, a squeeze resistor formed within the anode diffusion layer 11 may be used. Furthermore, a resistor formed on the semiconductor substrate 17 (or in the epitaxial layer 14) may be employed.

Example 4

Figure 12:
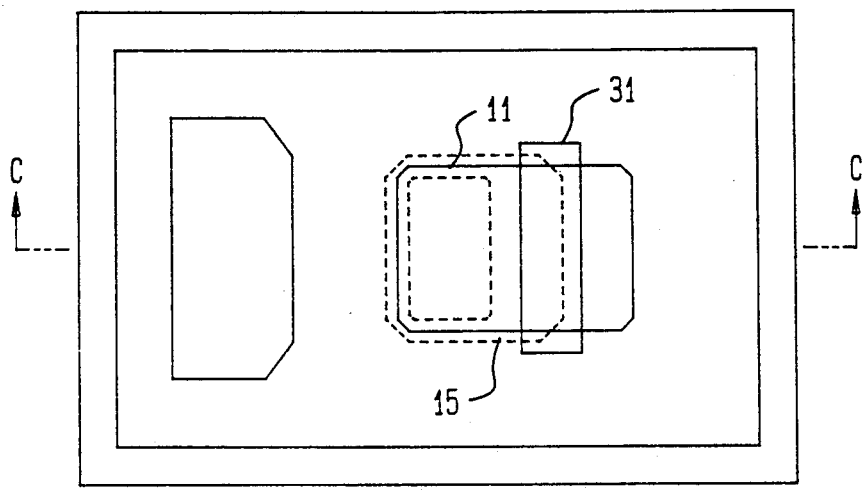
FIG. 12 is a schematic plan view showing of still another lateral thyristor this invention, which is identical to the lateral thyristor of FIG. 10, except that the resistor employed therein is replaced by a squeeze resistor.
Figure 13:
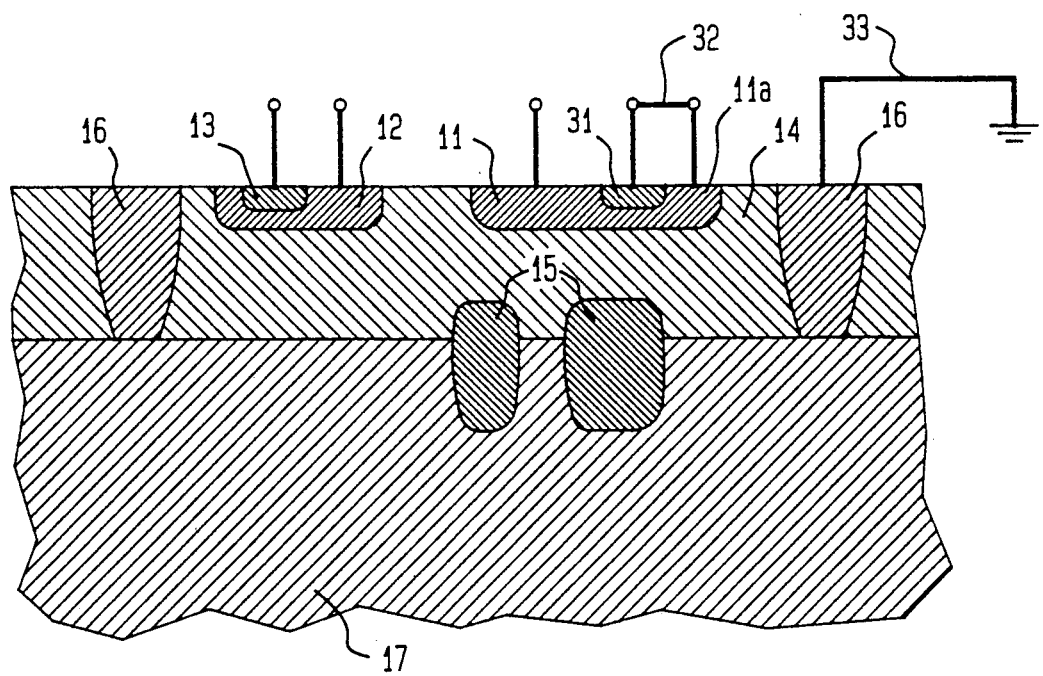
FIG. 13 is a schematic sectional view taken along line C—C of FIG. 12.

FIG. 12 shows still another lateral thyristor of this invention, which has a squeeze resistor formed within the anode diffusion layer 11. FIG. 13 is a schematic sectional view taken along line C—C of FIG. 12.

The lateral thyristor shown in these two figures includes an N+-type diffusion layer 31 formed within the epitaxial layer 14, which is shallow as compared with the anode diffusion layer 11. Most portions of the diffusion layer 31 are formed inside the anode diffusion layer 11, while a portion thereof extends outside the region where the anode diffusion layer 11 is formed, so as to be electrically connected to the epitaxial layer 14. Furthermore, the N+-type diffusion layer 31 is connected to the extending portion 11a of the anode diffusion layer 11 and to a point in region 30a under diffusion layer 31 through a wiring 32 formed above the epitaxial layer 14.

According to such a construction, a circuit is formed in which the epitaxial layer 14, the N+-type diffusion layer 31, the wiring 32, and the anode diffusion layer 11 are connected in series. Because of the presence of the N+-type diffusion layer 31, the thickness of the anode diffusion layer 11 is reduced at the portion thereof positioned below the N+-type diffusion layer 31, increasing the sheet resistance at that portion. The portion of the anode diffusion layer 11 having the increased resistance acts as a squeeze resistor.

Example 5

Figure 14:
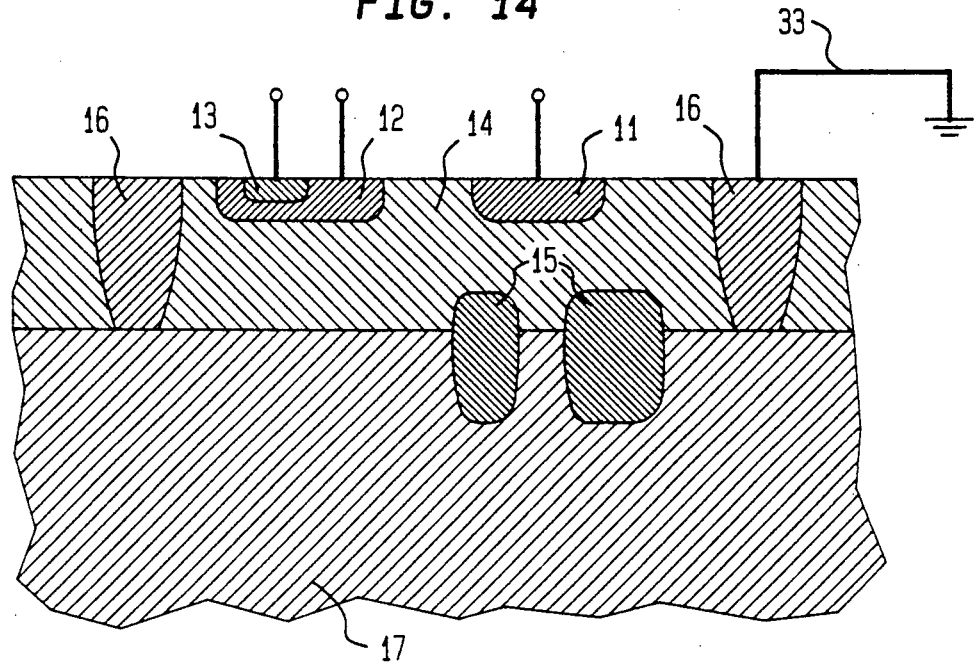
FIG. 14 is a schematic sectional view showing still another lateral thyristor of this invention.
Figure 20:
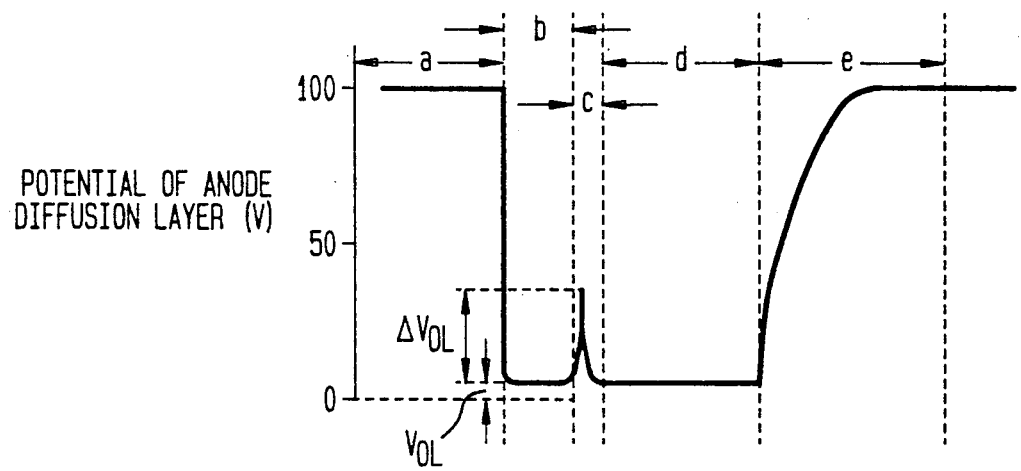
FIG. 20 is a graph sowing the transient characteristics of the "on" voltage obtained when the conventional lateral thyristor is used as the driver for a flat display panel.

FIG. 14 shows still another lateral thyristor of this invention.

The major difference in the construction between the lateral thyristor of this example and that of Example 1 is that the semiconductor substrate 17 is grounded via the isolating diffusion layer 16 and the wiring 33 connected to the isolating diffusion layer 16.

In such a construction, of the current flowing into the anode diffusion layer 11, the current flowing into the semiconductor substrate 17 through the parasitic PNP transistor passes rapidly to the ground, thus preventing a variation in the potential of the semiconductor substrate 17.

According to the construction of this example, if the potential of the semiconductor substrate 17 and the isolating diffusion layer 16 becomes too high because of the excessive current flowing into the semiconductor substrate 17, latch-up may be caused by a parasitic thyristor formed within the lateral thyristor.

Figure 15:
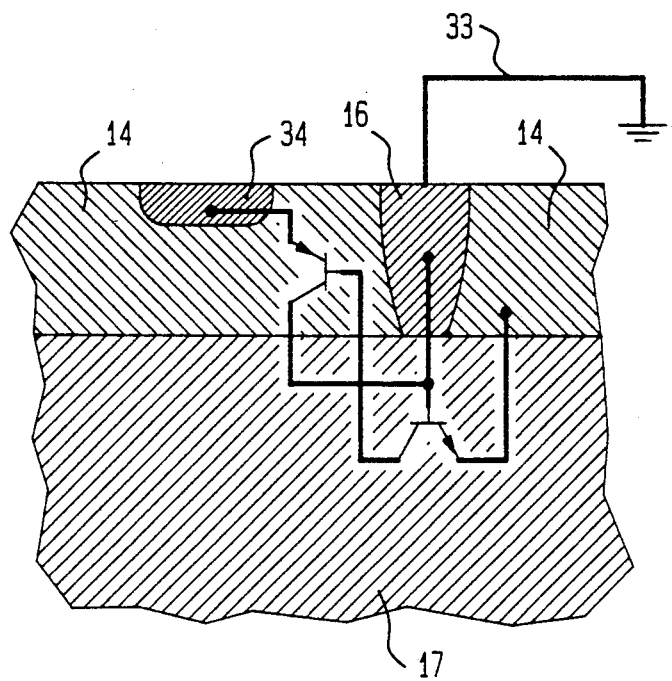
FIG. 15 is a schematic sectional view showing a parasitic thyristor.
Figure 16:
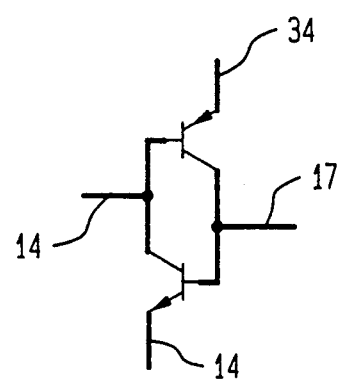
FIG. 16 is a diagram showing an equivalent circuit of the parasitic thyristor of FIG. 15.

FIG. 15 shows the construction of one example of such a parasitic thyristor. FIG. 16 shows an equivalent circuit of the parasitic thyristor. The parasitic thyristor is composed of: a vertical parasitic PNP transistor comprising a P-type diffusion layer 34 formed in the N-type epitaxial layer 14, the N-type epitaxial layer 14, and the P-type semiconductor substrate 17; and a horizontal parasitic NPN transistor comprising the N-type epitaxial layer 14, the P-type semiconductor substrate 17, and the N-type epitaxial layer 14.

However, the construction of this example serves to solve the above-mentioned problem because the potential of the semiconductor substrate 17 is maintained at a low level at which latch-up will not occur.

Since the lateral thyristor has such a construction as to allow an excessive current to flow into the semiconductor substrate 17 through the parasitic PNP transistor, the potential of the semiconductor substrate 17 thereof tends to rise readily. Therefore, the construction of this embodiment has the advantage of providing particularly stable switching operation.

In any of the above examples, the lateral thyristor has a construction in which the first conductive type is P-type and the second conductive type is N-type, but the same advantages achieved by the above examples can also be expected from a lateral thyristor having an inverted construction in which the first conductive type is N-type and the second conductive type is P-type.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A lateral thyristor comprising a semiconductor substrate of a first conductivity type, an epitaxial layer of a second conductivity type formed on said semiconductor substrate, an anode diffusion layer of the first conductivity type formed in said epitaxial layer, a gate diffusion layer of the first conductivity type formed in said epitaxial layer, a cathode diffusion layer of the second conducting type formed in said gate diffusion layer, and a buried layer of the second conductivity type formed below said anode diffusion layer and extending between the semiconductor substrate and the epitaxial layer, wherein there is a region directly below the anode diffusion layer not occupied by said buried layer.

2. A lateral thyristor according to claim 1, wherein the ratio of the area of the region where said anode diffusion layer is formed in said epitaxial layer to the area of the region where said anode diffusion layer and said buried layer do not overlap each other, when the lateral thyristor is viewed in a direction perpendicular to the principal surface of said semiconductor substrate, is in the range of 10% to 90%.

3. A lateral thyristor according to claim 1, wherein said semiconductor substrate is grounded.

4. A lateral thyristor according to claim 1, wherein a resistor is provided between the epitaxial layer and a diffusion layer within the anode diffusion layer.

5. A lateral thyristor according to claim 4, wherein said resistor is a polysilicon resistor.

6. A lateral thyristor according to claim 4, further comprising a fourth diffusion layer of the second conductivity type formed in said anode diffusion layer, said fourth diffusion layer of the second conductivity type being shallow as compared with said anode diffusion layer, a portion of said fourth diffusion layer of the second conductivity type extending horizontally outside the region where said anode diffusion layer is formed and being electrically connected to said epitaxial layer, and said fourth diffusion layer of the second conductivity type being also electrically connected to a portion of said anode diffusion layer through a wiring formed above said epitaxial layer, wherein the portion of said anode diffusion layer below said fourth diffusion layer of the first conductivity type acts as said resistor.

* * * * *

UNITED STATES PATENT AND TRADEMARK OFFICE
CERTIFICATE OF CORRECTION

PATENT NO. : 5,142,348
DATED : August 25, 1992
INVENTOR(S) : Imahashi et al.

It is certified that error appears in the above-indentified patent and that said Letters Patent is hereby corrected as shown below:

In the Drawings, FIGS. 4, 11, 13 and 19, should be deleted and substitute therefor FIGS. 4, 11, 13 and 19, as shown on the pages.

Signed and Sealed this

Twelfth Day of October, 1993

*Attest:*

BRUCE LEHMAN

*Attesting Officer*  *Commissioner of Patents and Trademarks*